US011773724B2

(12) United States Patent
Shah et al.

(10) Patent No.: US 11,773,724 B2
(45) Date of Patent: *Oct. 3, 2023

(54) WROUGHT ROOT BLADE MANUFACTURE METHODS

(71) Applicant: Raytheon Technologies Corporation, Farmington, CT (US)

(72) Inventors: Dilip M. Shah, Glastonbury, CT (US); Alan D. Cetel, West Hartford, CT (US); Venkatarama K. Seetharaman, Rocky Hill, CT (US)

(73) Assignee: RTX Corporation, Farmington, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/711,441

(22) Filed: Apr. 1, 2022

(65) Prior Publication Data

US 2022/0364472 A1 Nov. 17, 2022

Related U.S. Application Data

(63) Continuation of application No. 16/131,451, filed on Sep. 14, 2018, now Pat. No. 11,306,595.

(51) Int. Cl.
*B23P 15/02* (2006.01)
*C22F 1/10* (2006.01)
(Continued)

(52) U.S. Cl.
CPC .............. *F01D 5/147* (2013.01); *B21J 5/002* (2013.01); *B21J 5/02* (2013.01); *B23P 15/02* (2013.01);
(Continued)

(58) Field of Classification Search
CPC .......... F01D 5/147; F01D 5/3007; F01D 5/34; B21J 5/002; B21J 5/02; B21J 1/06;
(Continued)

(56) References Cited

U.S. PATENT DOCUMENTS 2,660,779 A 12/1953 Atkinson
2,928,650 A 3/1960 Hooker et al.
(Continued)

FOREIGN PATENT DOCUMENTS

EP 0513407 A1 11/1992
EP 3178959 A1 6/2017
(Continued)

OTHER PUBLICATIONS

European Office Action dated Dec. 15, 2022 for European Patent Application No. 19195215.9.
(Continued)

*Primary Examiner* — Rick K Chang
(74) *Attorney, Agent, or Firm* — Bachman & LaPointe, P.C.

(57) ABSTRACT

A method for manufacturing a blade, the method includes casting a nickel alloy blade precursor having an airfoil and a root. The airfoil and the root are solution heat treating differently from each other. After the solution heat treating, the root is wrought processed. After the wrought processing, an exterior of the root is machined.

20 Claims, 7 Drawing Sheets

(51) Int. Cl.
  *F01D 5/14* (2006.01)
  *B21J 5/00* (2006.01)
  *B21J 5/02* (2006.01)
  *C21D 9/00* (2006.01)
  *F01D 5/30* (2006.01)

(52) U.S. Cl.
  CPC .............. *C21D 9/0068* (2013.01); *C22F 1/10* (2013.01); *F01D 5/3007* (2013.01); *C21D 2221/00* (2013.01); *C21D 2261/00* (2013.01); *F05D 2230/21* (2013.01); *F05D 2230/25* (2013.01); *F05D 2230/40* (2013.01); *F05D 2230/90* (2013.01); *F05D 2240/30* (2013.01); *F05D 2300/175* (2013.01)

(58) Field of Classification Search
  CPC ........ B21J 5/008; B23P 15/02; C21D 9/0068; C21D 2221/00; C21D 2261/00; C22F 1/10; C22F 1/002; F05D 2230/21; F05D 2230/25; F05D 2230/40; F05D 2230/90; F05D 2240/30; F05D 2300/175; F05D 2230/11; F05D 2230/12; F05D 2230/211; C30B 11/00; C30B 29/52; C30B 33/02; B21K 3/04; B23H 9/10
  See application file for complete search history.

(56) References Cited

U.S. PATENT DOCUMENTS

| | | | |
|---|---|---|---|
| 4,514,360 A | 4/1985 | Giamei et al. | |
| 4,528,048 A | 7/1985 | Gell et al. | |
| 4,680,160 A | 7/1987 | Helmink | |
| 5,190,603 A | 3/1993 | Nazmy et al. | |
| 5,299,353 A | 4/1994 | Nazmy et al. | |
| 7,338,259 B2 | 3/2008 | Shah et al. | |
| 8,147,749 B2 | 4/2012 | Reynolds | |
| 9,138,963 B2 | 9/2015 | Cetel et al. | |
| 10,005,125 B2 | 6/2018 | Shah et al. | |
| 11,306,595 B2 * | 4/2022 | Shah | F01D 5/147 |
| 2006/0277754 A1 | 12/2006 | Rockstroh et al. | |
| 2008/0277384 A1 | 11/2008 | Trimmer et al. | |
| 2010/0043929 A1 | 2/2010 | Hobbs et al. | |
| 2013/0108445 A1 | 5/2013 | Suciu et al. | |
| 2015/0147184 A1 | 5/2015 | de Diego et al. | |
| 2017/0088926 A1 | 3/2017 | Shah et al. | |
| 2017/0130289 A1 | 5/2017 | Shah et al. | |
| 2017/0167008 A1 | 6/2017 | Schneider et al. | |
| 2017/0335691 A1 | 11/2017 | Crites et al. | |

FOREIGN PATENT DOCUMENTS

| | | | |
|---|---|---|---|
| GB | 2152076 A | 7/1985 | |
| GB | 2454187 A | 5/2009 | |
| JP | 201447389 A | 3/2014 | |
| WO | 2013/143995 A1 | 10/2013 | |

OTHER PUBLICATIONS

Extended European Search Report dated Feb. 19, 2020 for European Patent Application No. 19195215.9.

U.S. Office Action dated Aug. 6, 2020 for U.S. Appl. No. 16/131,451.

* cited by examiner

WROUGHT ROOT BLADE MANUFACTURE METHODS

CROSS-REFERENCE TO RELATED APPLICATION

This is a continuation of U.S. patent application Ser. No. 16/131,451, filed Sep. 14, 2018, and entitled "Wrought Root Blade Manufacture Methods", the disclosure of which is incorporated by reference herein in its entirety as if set forth at length.

BACKGROUND

The disclosure relates to turbomachine blade manufacture. More particularly, the disclosure relates to manufacture of metallic blades for gas turbines and associated high pressure compressors.

U.S. Pat. No. 9,138,963, Cetel et al., Sep. 22, 2015, and entitled "Low sulfur nickel base substrate alloy and overlay coating system" (the '963 patent) discloses a group of nickel-based superalloys used in directionally solidified (DS) blades such as single-crystal (SX) blades. The disclosure of the '963 patent is incorporated by reference herein in its entirety as if set forth at length.

U.S. Pat. No. 4,514,360, Giamei et al., Apr. 30, 1985, and entitled "Wrought single crystal nickel base superalloy" (the '360 patent) and U.S. Pat. No. 4,528,048, Gell et al., Jul. 9, 1985, and entitled "Mechanically worked single crystal article" (the '048 patent) disclose that strength of the root attachment of a single crystal blade can be enhanced up to 50% by forging it by 15% in its fully heat treated condition. Such blades may be mounted in firtree slots in a turbine or compressor disk. An example of such a powder metallurgical (PM) nickel-based superalloy disk is given in U.S. Pat. No. 8,147,749, Reynolds, Apr. 3, 2012, and entitled "Superalloy compositions, articles, and methods of manufacture" (the '749 patent), the disclosure of which is incorporated by reference herein in its entirety as if set forth at length.

United States Patent Application Publication 20170130289A1 (the '289 publication), Shah et al., published May 11, 2017, and entitled "High Elastic Modulus Shafts and Method of Manufacture", discloses a turbine engine shaft manufacture wherein a cylinder is hot worked into a shaft form. United States Patent Application Publication 20170088926A1 (the '926 publication), Shah et al., Mar. 30, 2017, and entitled "Nickel Based Superalloy With High Volume Fraction of Precipitate Phase" discloses approaches to swage single crystal bars without the intervention of recrystallization. The disclosures of the '289 and '926 publications are incorporated by reference herein in their entireties as if set forth at length.

SUMMARY

One aspect of the disclosure involves a method for manufacturing a blade. The method comprises: casting a nickel alloy blade precursor having an airfoil and a root; solution heat treating the airfoil and the root differently from each other; after the solution heat treating, wrought processing of the root; and after the wrought processing, machining an exterior of the root.

A further embodiment of any of the foregoing embodiments may additionally and/or alternatively include the casting forming cooling passageways in the airfoil.

A further embodiment of any of the foregoing embodiments may additionally and/or alternatively include machining feed passageways in the root to join the cooling passageways in the airfoil.

A further embodiment of any of the foregoing embodiments may additionally and/or alternatively include the machining the exterior comprising mechanical grinding and electro-chemical machining; and the machining feed passageways comprising electro-discharge machining.

A further embodiment of any of the foregoing embodiments may additionally and/or alternatively include the solution heat treating providing the root with larger average gamma prime size than the average gamma prime size of the airfoil.

A further embodiment of any of the foregoing embodiments may additionally and/or alternatively include the solution heat treating providing the root with at least 2.0 times the average gamma prime size than the average gamma prime size of the airfoil.

A further embodiment of any of the foregoing embodiments may additionally and/or alternatively include the solution heat treating comprising: fully solutioning and cooling the airfoil and root; and resolutioning the root while isolating the airfoil from the resolution heating.

A further embodiment of any of the foregoing embodiments may additionally and/or alternatively include the solution heat treating comprising: heating and cooling the airfoil and root; and heating the root while isolating the airfoil from the heating.

A further embodiment of any of the foregoing embodiments may additionally and/or alternatively include the solution heat treating comprising: heating the airfoil and root; and cooling the airfoil while isolating the root from the cooling so as to cool more slowly.

A further embodiment of any of the foregoing embodiments may additionally and/or alternatively include the wrought processing comprising a sequence of individual transverse cross-sectional area reductions of at least 4%.

A further embodiment of any of the foregoing embodiments may additionally and/or alternatively include the wrought processing comprising alternating transverse compactions and beatings.

A further embodiment of any of the foregoing embodiments may additionally and/or alternatively include the wrought processing comprising at least 10 swagings.

A further embodiment of any of the foregoing embodiments may additionally and/or alternatively include the solution heat treating the airfoil and the root differently from each other comprising active cooling.

A further embodiment of any of the foregoing embodiments may additionally and/or alternatively include the wrought processing being effective to provide 10%-75% reduction in cross-sectional area.

A further embodiment of any of the foregoing embodiments may additionally and/or alternatively include the machining leaving the root as a firtree root.

A further embodiment of any of the foregoing embodiments may additionally and/or alternatively include the machining comprising grinding.

A further embodiment of any of the foregoing embodiments may additionally and/or alternatively include the machining leaving the root as having a firtree portion and a spoke portion of greater radial span than the firtree portion.

A further embodiment of any of the foregoing embodiments may additionally and/or alternatively include the machining comprising grinding.

A further embodiment of any of the foregoing embodiments may additionally and/or alternatively include a method for manufacturing a bladed disk. The method includes manufacturing as above a plurality of blades and further comprises mounting the blades in a powder metallurgical (PM) disk.

A further embodiment of any of the foregoing embodiments may additionally and/or alternatively include the mounting comprising at least one of transient liquid phase bonding (TLP), inertial friction welding, and mechanical attachments via fir-tree type or dovetail type attachment.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
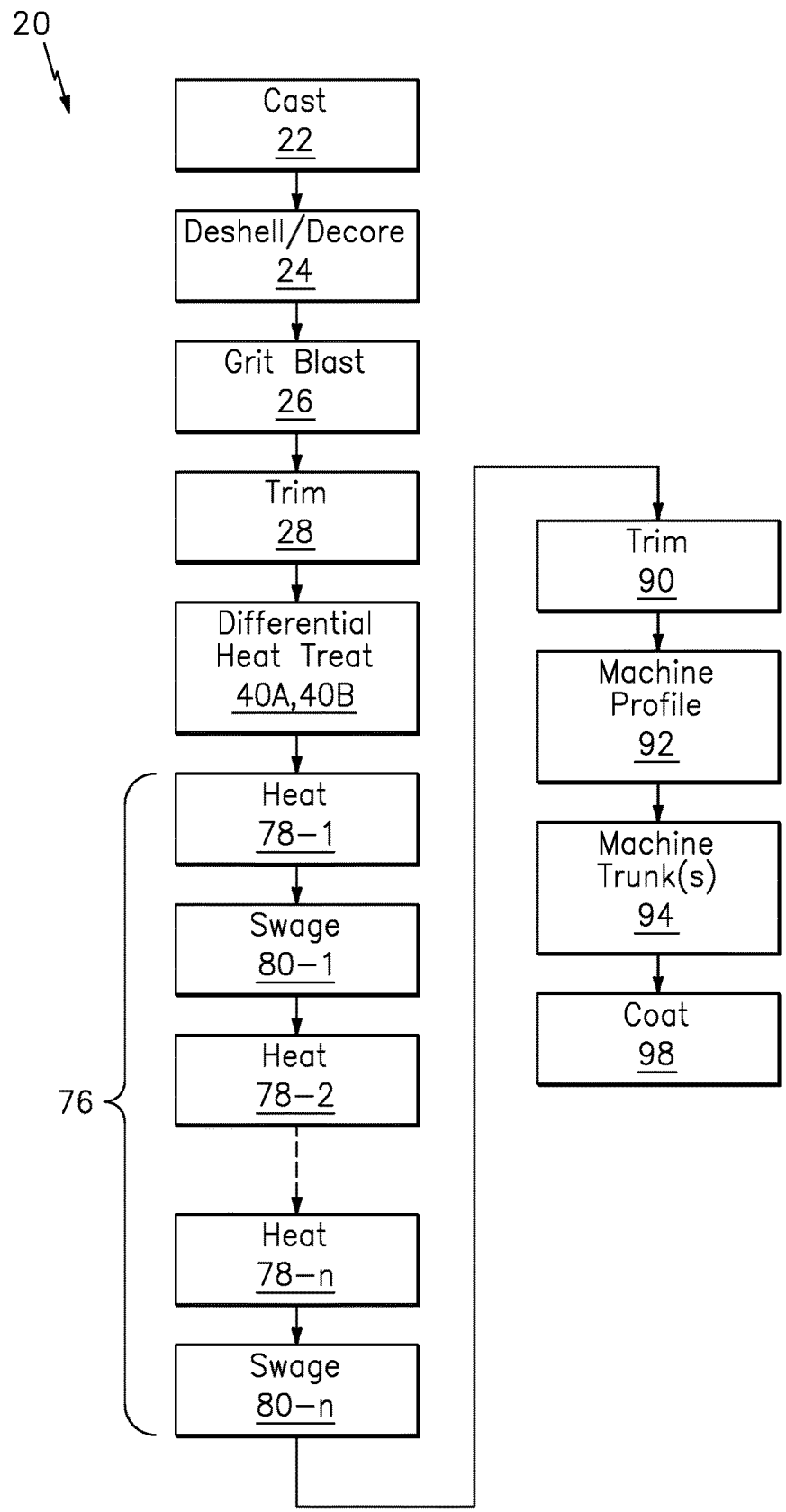
FIG. 1 is a flowchart of blade manufacture.

FIG. 1 shows a process 20 for blade manufacture. As is discussed in detail below, the process may depart from a conventional casting in that there is wrought processing of a root precursor to facilitate advantageous root properties (e.g., low cycle fatigue properties). In contrast with the proposal in U.S. Pat. No. 4,514,360, the departure from a baseline process may first prepare a casing with differential airfoil v. root precursor properties to facilitate the wrought processing.

Figure 2:
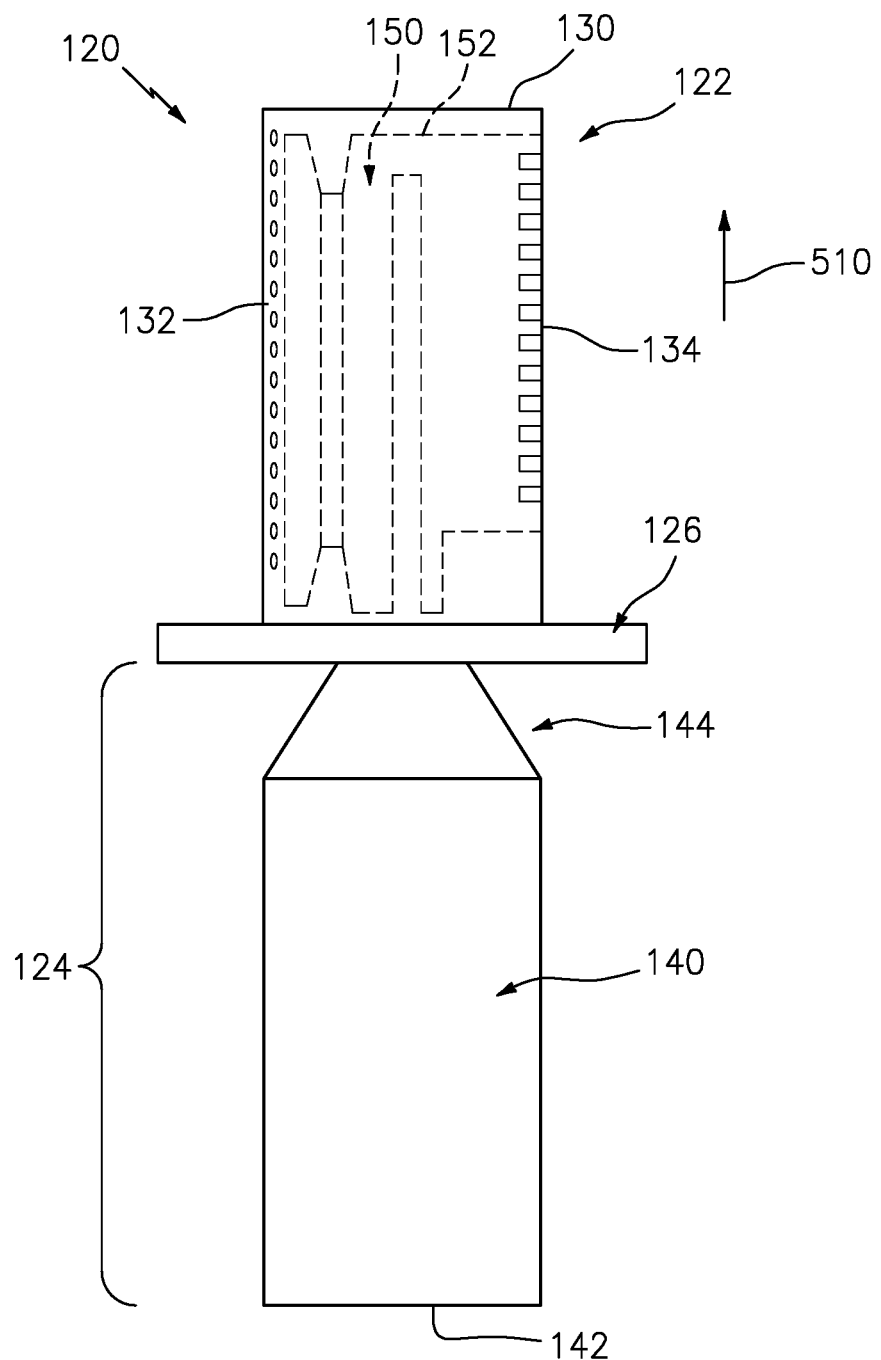
FIG. 2 is a partially schematic view of a blade precursor as cast.

An initial casting step 22 casts a blade precursor 120 (FIG. 2). The blade precursor is cast from a nickel-based superalloy and has an airfoil 122 and a root 124. The airfoil is a precursor of the final airfoil but still airfoil shaped (e.g., subject to trimming at the tip or gating and then finish machining). In the exemplary blade precursor, the precursor also includes a platform 126 forming a precursor of the ultimate blade platform.

The airfoil 122 extends along a span from an inboard (radially inboard in the ultimate engine frame of reference) end at an outboard surface of the platform 126 to a tip 130. An outward radial direction or spanwise direction 510 is also shown. FIG. 2 further shows the airfoil as extending from a leading edge 132 to a trailing edge 134 and having a pressure side and a suction side.

The root 124 is a precursor of the final root but not having the basic root shape (e.g., may be a block-like shape such as a cylinder (e.g., right circular cylinder or rectangular cylinder/prismatic shape) having no convolutions of a fir tree shape of the ultimate blade root). This is a first potential departure from a baseline process. In this particular example, the root precursor or stub 124 has a cylindrical section 140 extending to an inboard end 142. A transition section 144 extends between the outboard end of the cylindrical section and the underside of the platform. The transition section may serve two purposes. First, as is discussed below, it may form a reduced thickness (in at least one transverse dimension) region whose thickness the portion 140 is ultimately thinned down toward. Second, its transverse cross-section (e.g., normal to the spanwise direction 510) may transition between the shape of the cylinder 140 and a footprint more appropriately configured to transfer loads between the ultimate root and the airfoil. Thus, it may transition from relatively circular at the portion 140 to relatively rectangular at the platform underside.

The exemplary casting is an investment casting process using a casting core (e.g., ceramic or a combination of ceramic and refractory metal core(s) (RMC)) 150 to form cooling passageways 152 in the airfoil. The exemplary casting step does not form passageways in the root precursor or stub. This is a second possible departure from a baseline process that has a ceramic core forming passageways extending through the root and airfoil. As-cast, the casting has dendritic microstructure throughout.

A deshelling/decoring step 24 (e.g., mechanical deshelling and alkaline and/or acid decoring) may leave a raw casting. A grit blasting 26 may clean up residual shell/core. The amount of grit blasting may be limited to avoid subsequent recrystallization. Gating removal 28 may be via sawing.

The subsequent heat treatment 40A; 40B is configured to convert the microstructure from dendritic to homogeneous while optimizing relative gamma prime sizes in the airfoil and root stub. Maximization of creep resistance in the airfoil is associated with relatively fine precipitate structure at the solution heat treatment stage (e.g., gamma prime in airfoil is finally coarsened to 0.3-0.5 micrometer for optimum creep properties after subsequent coating diffusion and other heat treatment cycles). Workability of the root stub is associated with larger/coarser average gamma prime (e.g., 2.0-3.0 micrometers, more broadly, at least 0.5 micrometer or at least 1.0 micrometer or 0.5-5.0 micrometers or 1.0-4.0 micrometers). Exemplary average precipitate size in the root stub may be 1.5 or more times that of the airfoil, more particularly at least 2.0 or at least 5.0, or an exemplary 5.0-20.0 or 5.0-10.0.

Figure 1A:
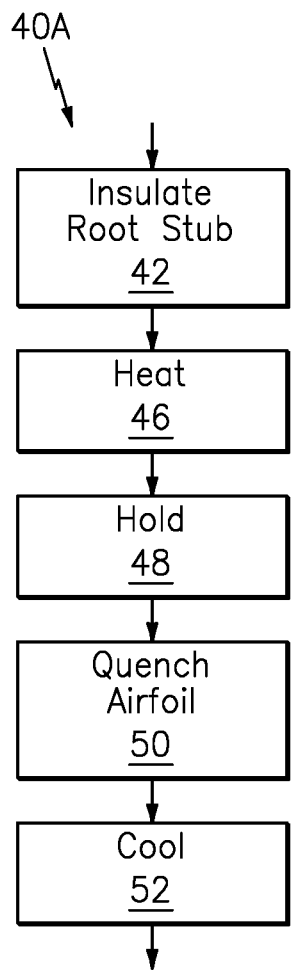
FIG. 1A is a flowchart of a differential heat treatment in the blade manufacture of FIG. 1.
Figure 1B:
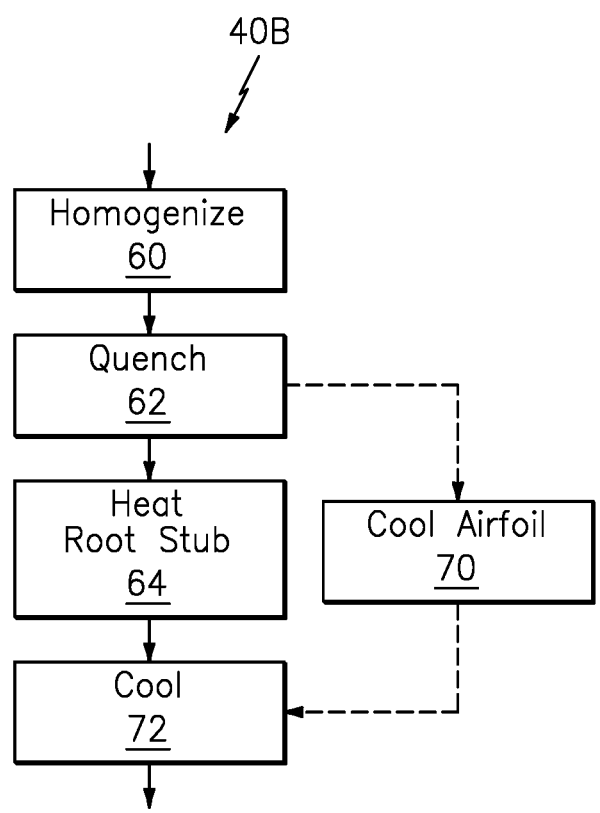
FIG. 1B is a flowchart of an alternative differential heat treatment in the blade manufacture of FIG. 1.
Figure 3:
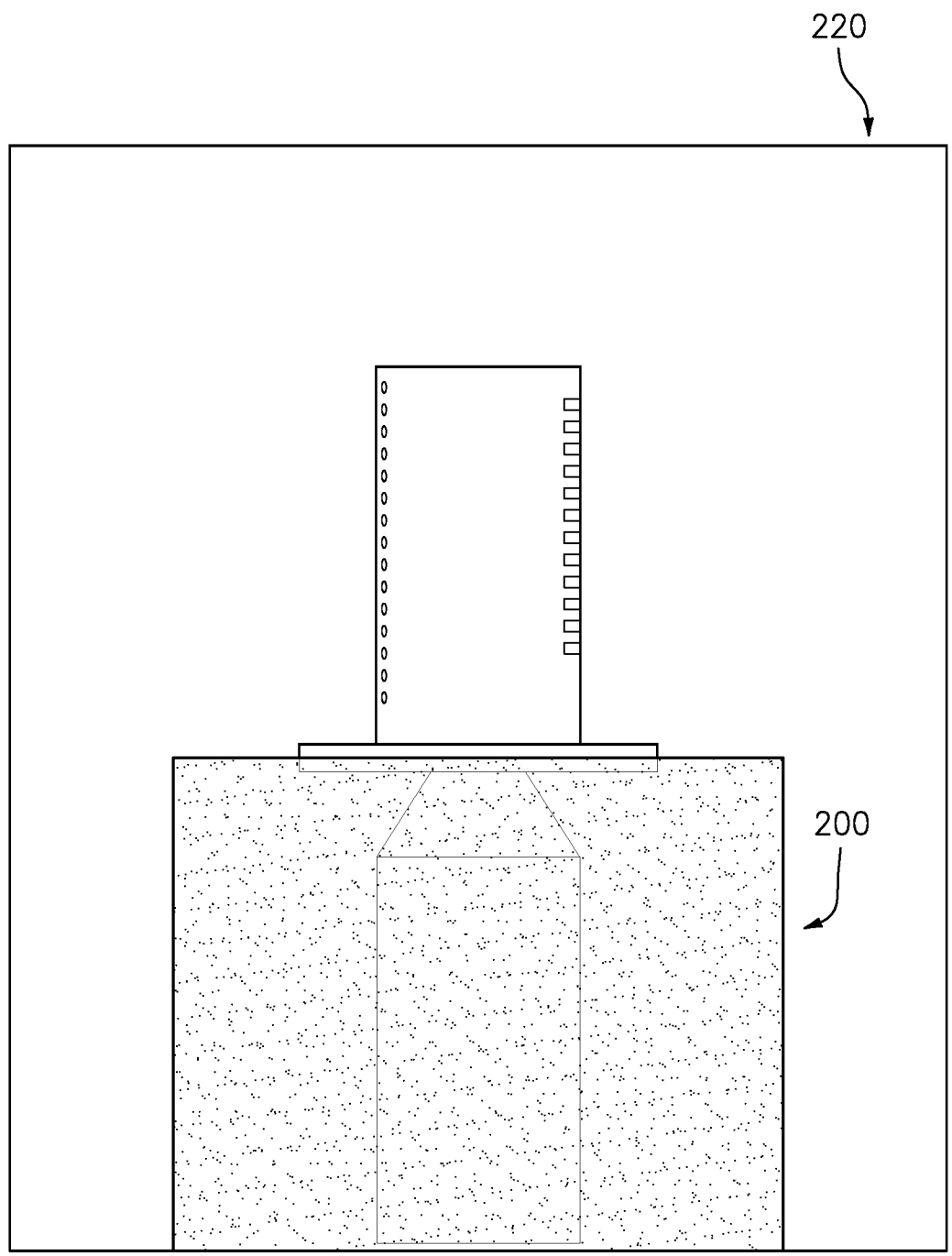
FIG. 3 is a schematic view of the blade precursor in a first heat treatment furnace.

To prepare for working, a first differential heat treating option 40A (FIG. 1A) involves applying 42 insulation 200 (FIG. 3) to the root stub. One example is blanket-form ceramic fiber alumina-silica material with low thermal conductivity (e.g., FIBERFRAX material from Unifrax I LLC, Tonawanda, N.Y.).

An example discussed below uses a Ni-based superalloy having nominal composition by weight percent of 5.0 Cr, 1.9 Mo, 5.9 W, 8.7 Ta, 5.65 Al, 10.0 Co, 3.0 Re, 0.1 Hf, balance Ni. Table I below lists further SX candidates mostly drawn from the '963 patent. Compositional ranges of superalloys encompassing these individual table entries may also be relevant.

TABLE I

| Alloy | Cr | Ti | Mo | W | Ta | Re | Al | Co | B | Zr | C | Hf | Ru | Y | Ni |
|---|---|---|---|---|---|---|---|---|---|---|---|---|---|---|---|
| A | 4-7 | 0-0.5 | 1.5-2.5 | 5-7 | 6-9 | 2-4 | 5-6.2 | 8-12 | 0-.01 | 0-.01 | 0-.06 | .1-.5 | 0-2 | 0-.03 | bal |
| B | 8-12 | 1-2 | 0-0.5 | 3-5 | 10-14 | 0 | 4.5-5.6 | 4-6 | 0-.01 | 0-.01 | 0-.06 | 0-.5 | 0 | 0-.03 | bal |
| C | 11-13 | 3.5-5 | 1-2 | 3-5 | 3-6 | 0 | 3-4 | 8-10 | 0-.01 | 0-.01 | .02-.10 | 0-.5 | 0 | 0 | bal |
| D | 3-6 | 0-.5 | 1.5-2.5 | 8-10 | 8-10 | 0-1.5 | 5.5-6.5 | 10-13 | 0-.01 | 0-.01 | 0-.06 | .1-.5 | 0 | 0-.03 | bal |
| E | 1.5-2.5 | 0-.5 | 1.5-2.5 | 5-7 | 7.5-8.5 | 2-4 | 5.5-6 | 14-18 | 0-.01 | 0-.01 | 0-.06 | .1-.5 | 2-4 | 0-.03 | bal |
| F | 6-7 | 0-.5 | 1.5-2.5 | 5-7 | 6-7 | 0-3 | 6-6.5 | 6-9 | 0-.01 | 0-.01 | 0-.06 | .1-.2 | 0 | 0-.03 | bal |
| G | 5-7 | .5-1.5 | .5-1.5 | 5-8 | 6-8 | 0-3 | 5.5-6-5 | 8-10 | 0-.01 | 0-.01 | 0-.06 | .1-.2 | 0 | 0-.03 | bal |
| H | 3-6 | 0-.5 | 0-3 | 5-7 | 4-7 | 4-6 | 5.5-6.5 | 1.5-13 | 0-.01 | 0-.01 | .1-.2 | .1-.2 | 2-5 | 0-.03 | bal |
| I | 5 | 0 | 1.9 | 5.9 | 3.0 | 2-4 | 5.65 | 10.0 | 0 | 0 | 0 | .1 | 0 | 0 | bal |

The blade with root stub insulation is placed in a heat treat furnace 220 and slowly heated 46 to elevate an elevated temperature (e.g., to a temperature of 1310° C. over a time of at least 6 hours to ramp up to solutioning temperature). The casting is held isothermally 48 (e.g., 4 hours, more broadly, at least 2.0 hours) and homogenizes. In an example using the exemplary alloy, the temperature is 2400° F. (1316° C.) for 4 hours to fully solution. The heating and hold/dwell are long enough so that there is little or no observable difference in effect on microstructure. A rapid cool/quench 50 follows (e.g., using an argon gas stream). In the absence of insulation, the airfoil cools quickly as in a conventional rapid quench. The insulated root stub cools much more slowly allowing the growth of larger gamma prime to impart the workability. In an example using the exemplary alloy, the slow stub cooling is at a rate of 0.3° F. (0.17° C.) per minute down to a threshold temperature of 2000° F. (1093° C.). Once at this threshold a more rapid cooling 52 may occur such as by opening the furnace and opening/removing the insulation.

An alternative second option 40B involves performing a conventional solution heat treat to the whole casting to homogenize 60. This is followed by a uniform rapid quench/cooling 62. To differentiate the root stub microstructure, the root stub may then be preferentially heated 64 (distinguished from the preferential cooling 50 of the airfoil in the first option 40A). The heating is to solution temperature (e.g., either using induction heating or conventional heating) and then heat input is reduced to achieve a desired cooling rate. In this process the airfoil area is kept below the temperature where no significant change in microstructure occurs.

Figure 4:
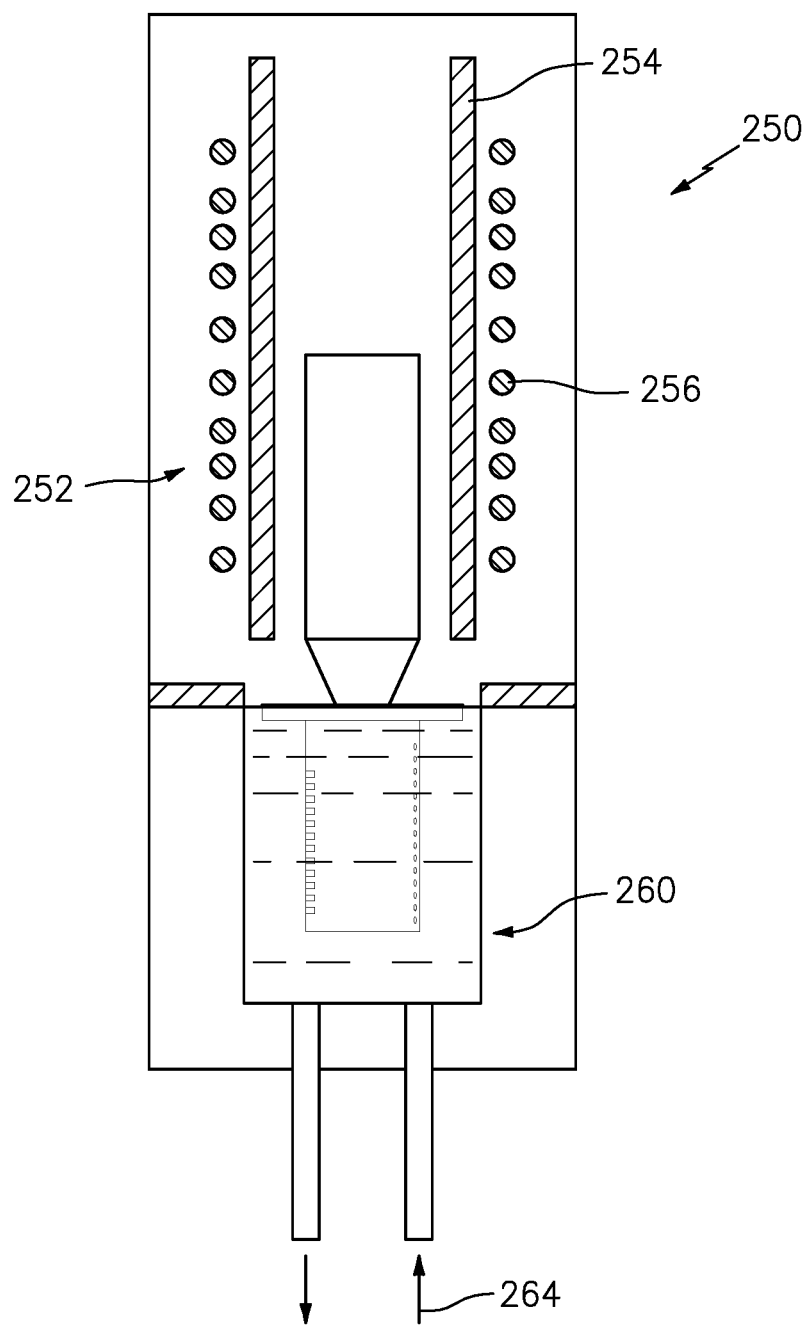
FIG. 4 is a schematic view of the blade precursor in an alternative second heat treatment furnace.

This preferential heating 64 may involve some combination of localizing energy input to the root stub, insulating the airfoil, or active cooling of the airfoil. FIG. 4 shows a furnace 250 similar to those used for directional solidification of single crystal castings. The casting may be inserted from below until the root stub area is in the hot section 252 of the furnace (e.g., surrounded by the susceptor 254 and induction coil(s) 256). The airfoil is in the cold section of the furnace (e.g. below a baffle). An optional conformal cooling jacket 260 carrying a flow 264 of water or other heat transfer liquid may capture and cool 70 the airfoil while the stub is heated 64. It is understood that in industrial practice, multiple articles may be heat treated as a batch and different active cooling and heating schemes could be applied.

In this second option 40B, exemplary root stub heating 64 is to a temperature of 2390° F. (1310° C.). Exemplary cool-down 72 time and rate are 22 hours and 0.3° F./minute (0.17° C./minute) to 2000° F. (1093° C.). The result is to leave the casting with the difference in gamma prime precipitate sizes discussed above. Thus, the airfoil may have the solution heat treated microstructure normally required for maximum creep resistance and the root stub has a super-overage microstructure which facilitates large deformation for the subsequent working.

Exemplary working 76 is a swaging process. Swaging is multi-step process with an initial preheating 78-1 and reheatings 78-2 . . . 78-$n$ between individual swagings 80-1 . . . 80-$n$. The result is that root stub dislocation density is greatly increased in order to improve fatigue properties. It may require a post-swage (pre- or post-machining 80) heat treatment 82 at temperatures up to 2000° F. (1093° C.)

For example, to permit swaging, in each heating 78-1 . . . 78-$n$ the blade may be heated to temperature below the recrystallization temperature or at the temperature at which the super-overage heat treatment was ended to anneal. With the exemplary alloy above, an exemplary temperature is 1900° F. to 1950° F. (1038° C. to 1066° C.). While at said temperature, the root stub is swaged using a die set reducing the cross-sectional area (e.g., lengthening the root stub to reduce cross section transverse to a span-wise direction of the airfoil). Before swaging in the next die set, the blade is preferably annealed 78-2 . . . 78-$n$ at the temperature at which the super-overage heat treatment was ended. An exemplary number "n" of swagings is 5 to 40 or 10 to 30 or 15 to 30.

In an exemplary swaging machine, typically four split dies sit in its fast spinning core and resist opening when a metal piece of larger diameter is inserted, thereby causing reduction in diameter by impact. These dies typically have a tapered entrance to facilitate insertion of a cylindrical metal of slightly larger diameter than the die's exit diameter. Once the cylinder passes through the dies, the diameter is reduced close to the exit diameter. In most cases a cylindrical metal rod is inserted through the die and exits at the other end to swage down the entire length of the rod.

Figure 5:
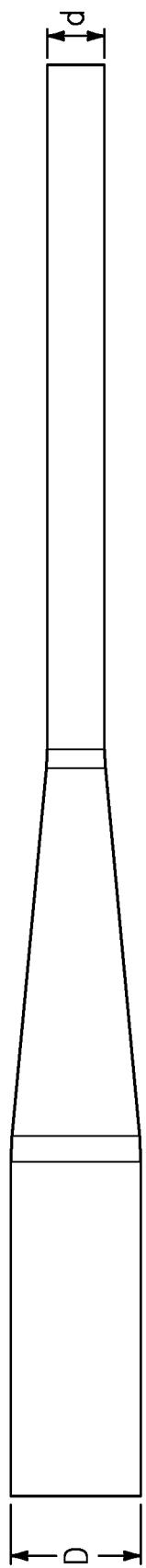
FIG. 5 is a view of a test rod swaged partially along a length.

FIG. 5 shows a partial (local) swage of a 0.75 inch (19 mm) diameter D single crystal rod by about 56% to a reduced diameter d of about 0.33 inch (8.4 mm) leaving a transition between swages and unswagged material. Swaging the root stub area may be similarly performed with the transition region (144 and/or an outboard portion of 40) being progressively less swaged toward the platform underside.

Normal swaging dies have a long tapered entrance but the dies can be inserted in the machine with the tapered end towards the exit to reduce the transition zone between the swaged stub and the platform. Or, as shown in many standard handbooks, a different die design can be used to achieve a reduced transition zone. For an example, in a typical swaging machine to reduce a 1.5 inch (38 mm) diameter cylinder by a 50% reduction in diameter (to 0.75 inch (19 mm)) or 75% reduction in cross-sectional area, about twenty-three die sets are required. Each die set reduces the diameter by approximately 0.035 inch (0.89 mm). This amounts to about 6.8% reduction in area and 7.3% increase in length. Because the volume of the material is conserved, this will result in 4× increase in the length. More broadly, exemplary per-swaging transverse area cross-sectional area reduction is 4% to 12% or 5% to 10%. Overall transverse area cross-sectional area reduction may be 25% to 90% or 50% to 85%.

Figure 6:
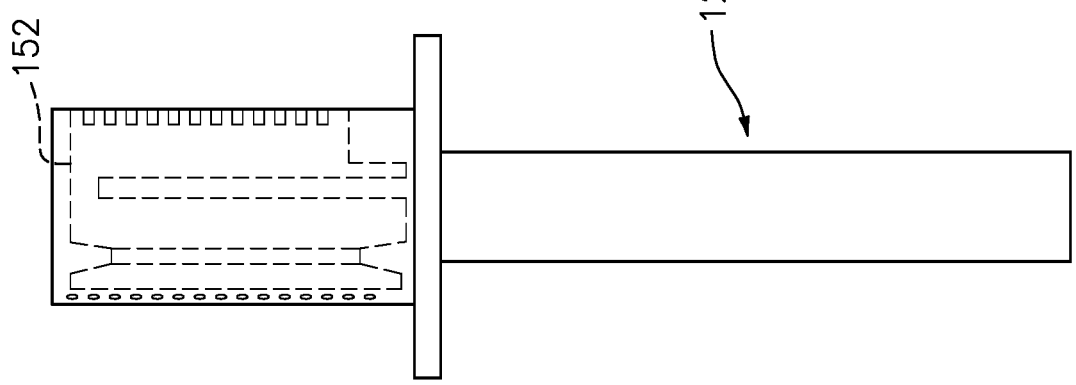
FIG. 6 is a view of the blade precursor post swaging.

FIG. 2 shows a pre-swage blade precursor. FIG. 6 shows a post-swage blade precursor with elongated/thinned root stub 124'. At this point, the root stub may have a near circular cylindrical form due to the swaging. For an example of an initial 1.5 inch (38 mm) diameter by 2.0 inch (51 mm) length cylindrical stub portion, the resulting FIG. 6 length of the stub portion from the original cylinder is 8 inches (203 mm). The overall stub length is over 8 inches (203 mm) due to the material of the transition section.

Figure 7:
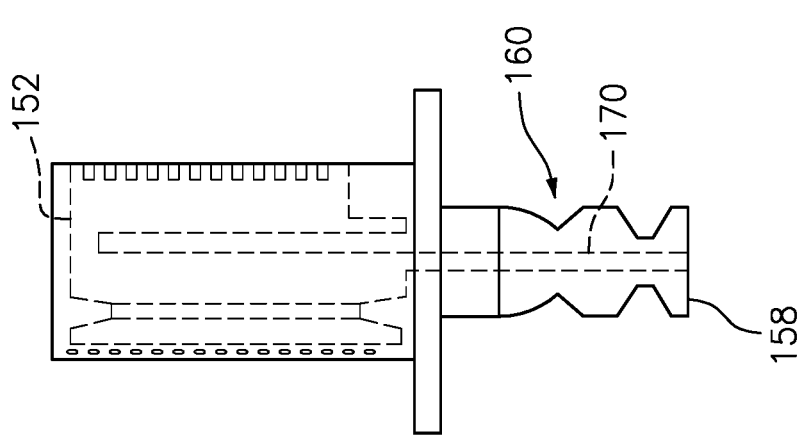
FIG. 7 is a view of a blade formed from the blade precursor.

FIG. 7 shows the final root after cutting away 90 excess stub length at the root inboard end 158 grinding in or electro-discharge machining 92 the fir tree or profile 160, and machining 94 feed passageway trunks 170. A multilayer ceramic thermal barrier coating (TBC) system may be applied 98 in a multi-step process involving several spray or vapor deposition stages for the ceramic preceded by similar such stages or plating of metallic or other bondcoat.

Figure 8:
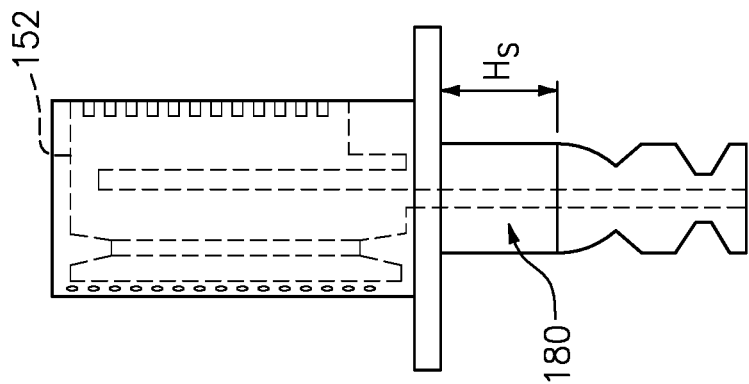
FIG. 8 is a view of an alternate blade formed from the blade precursor.

FIG. 8 shows an example where a long spoke section 180 having a length $H_s$ is left between the fir tree and the platform underside. See United States Patent Application Publication 20130108445A1, Suciu et al., May 2, 2013, entitled "Spoked Rotor for a Gas Turbine Engine", the disclosure of which is incorporated by reference in its entirety herein as if set forth at length. A swaged spoke may offer improved strength and fatigue resistance relative to a cast spoke. Thus, swaging may be used to expand the design space for a longer and thinner spoke and a thinner fir tree thereby reducing the blade weight and/or reducing the blade pull exerted on the disk.

The at least short spoke (e.g., $H_s$ at least 2 inch (5.1 cm) or an exemplary 6 inch (15 cm) to 12 inch (30 cm)) provides a gap between the turbine blade platform and the disk. This gap may improve thermal mechanical fatigue performance (TMF) of the disk because the disk outer diameter (OD) rim surface is shifted radially inward and away from the hot gas path. Also, a swaged spoke may better resist stress corrosion cracking in the corrosive environment of a secondary airflow. It has been shown that swaged single crystal is at least 100° F. (56° C.) better in creep resistance than some of the best powder material disk alloys currently used.

In the extreme, the swaging also opens up the possibility of designing with very long spoke. Beyond the traditional fir tree design, other attachment options similar to a bicycle spoke exist. Such arrangement may remove the notched fatigue associated with the fir tree design. Once the traditional barrier to the application of wrought single crystal is overcome, those well experienced in the application of superalloys will recognize many possibilities of hot working, shaping and, forming single crystal spoke attachment configurations, including bending like a bicycle spoke (e.g., to hook to one side for engaging a complementary feature of a disk). In an example of bent spoke formation, after the last swage 80-*n* (and optionally after the trimming 90), a reheat (not shown e.g., but similar to 78-1 through 78-*n*) may be performed prior to a bending operation to form a hook. Hook final machining may replace the profile machining 92.

Akin to swaging are other processes called cogging where instead of a round cross section, even square or hexagonal cross sections can be processed. For processing single crystal or coarse grain material, though such processes are likely to present additional challenges in terms of secondary crystal orientation and grain size distribution, respectively. For single crystal alloys, cogging in <110> secondary direction is preferable.

A further alternate wrought processing is a hot die forging. Hot die forging is typically performed on a single crystal (SX) part by heating the SX part at ~2000° F. (1093° C.), transferring and placing the SX part to between a pair of dies preheated to 1400-1600° F. (760-871° C.) and deforming or forging the SX part at strain rates in the range of 0.1 $s^{-1} \leq$ strain rate $\leq 10$ $s^{-1}$ in one or more increments. The total deformation (strain) may be approximately in the range 50-80%. Individual cross-sectional area reductions per forging step may be similar to those above for each swaging or cogging step.

An advantage of hot die forging is that fairly complex part geometry can be achieved as a result of the forging process without the intervention of cracking or recrystallization phenomena. Minimization of the "die chilling" effect leads to significant improvement in hot workability (compared to the situation wherein the dies are at room temperature).

Irrespective of how the root attachment is ultimately machined—traditional or with a short spoke or gap—machining of internal cooling passages through the root area will be required for a cooled blade. Although it may be possible to cast a turbine blade with the root stub having hollow passages and still swage, this can only be practiced for a given design with complete control on the process parameters, because the internal shape is expected to change. Thus, one would have to tailor the as-cast passageways in one form to transform through the swaging into another form. In case of a single crystal casting, control of secondary crystal orientation (e.g., via seed orientation) may be desirable for improved processability and reduction in the uncertainty of mechanical properties. For example, the primary <001> may be spanwise. <010> and <100> would be normal thereto. It may be desirable to have the <010> and <100> with a predetermined relationship to the airfoil so that the swagings may then have a predetermined relationship with the <010> and <100> directions.

Dovetail or firtree mountings may be axially mechanically retained to the disk via clamping. Alternative mounting comprises bonding such as transient liquid phase bonding (TLP) or inertial friction welding (optionally in combination with and mechanical interlocking attachments such as firtree type or dovetail type attachments).

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

Where a measure is given in English units followed by a parenthetical containing SI or other units, the parenthetical's units are a conversion and should not imply a degree of precision not found in the English units.

One or more embodiments have been described. Nevertheless, it will be understood that various modifications may be made. For example, when applied to an existing baseline engine configuration, details of such baseline may influence details of particular implementations. Accordingly, other embodiments are within the scope of the following claims.

What is claimed is:

1. A method for manufacturing a blade, the method comprising:
   casting a nickel alloy blade precursor having:
      an airfoil; and
      a root;
   solution heat treating the airfoil and the root differently from each other, the solution heat treating comprising:
      heating and cooling the airfoil and root; and
      heating the root while isolating the airfoil from the heating;
   after the solution heat treating, wrought processing of the root; and
   after the wrought processing, machining an exterior of the root.

2. The method of claim 1 wherein the casting forms cooling passageways in the airfoil.

3. The method of claim 2 further comprising machining feed passageways in the root to join the cooling passageways in the airfoil.

4. The method of claim 3 wherein:
   the machining the exterior comprises mechanical grinding and electro-chemical machining; and
   the machining feed passageways comprises electro-discharge machining.

5. The method of claim 3 wherein the wrought processing comprises:
   a sequence of individual transverse cross-sectional area reductions of at least 4%.

6. The method of claim 3 wherein:
   the wrought processing comprises alternating transverse compactions and heatings.

7. The method of claim 3 wherein:
   the wrought processing comprises at least 10 swagings.

8. The method of claim 1 wherein the solution heat treating provides the root with at least 2.0 times the average gamma prime size than the average gamma prime size of the airfoil.

9. The method of claim 1 wherein:
   the heating of the heating and cooling the airfoil and root fully solutions the airfoil and root; and
   said heating the root resolutions the root.

10. The method of claim 1 wherein the wrought processing comprises:
    a sequence of individual transverse cross-sectional area reductions of at least 4%.

11. The method of claim 1 wherein:
    the wrought processing comprises alternating transverse compactions and heatings.

12. The method of claim 1 wherein:
    the wrought processing comprises at least 10 swagings.

13. The method of claim 1 wherein:
    the solution heat treating the airfoil and the root differently from each other comprises active cooling.

14. The method of claim 1 wherein:
    the wrought processing is effective to provide 10%-75% reduction in cross-sectional area.

15. The method of claim 1 wherein:
    the machining leaves the root as a firtree root.

16. The method of claim 15 wherein:
    the machining comprises grinding.

17. The method of claim 1 wherein:
    the machining leaves the root as having a firtree portion and a spoke portion of greater radial span than the firtree portion.

18. The method of claim 17 wherein:
    the machining comprises grinding.

19. A method for manufacturing a bladed disk, the method including manufacturing according to claim 1 a plurality of blades and further comprising:
    mounting the blades in a powder metallurgical (PM) disk.

20. The method of claim 19 wherein:
    the mounting comprises at least one of transient liquid phase bonding (TLP), inertial friction welding, and mechanical attachments via fir-tree type or dovetail type attachment.

* * * * *